United States Patent [19]
Hoehn

[11] 4,323,794
[45] Apr. 6, 1982

[54] BIAS VOLTAGE GENERATOR FOR A MONOLITHIC INTEGRATED CIRCUIT

[75] Inventor: Wolfgang Hoehn, Kirchzarten, Fed. Rep. of Germany

[73] Assignee: ITT Industries, Inc., New York, N.Y.

[21] Appl. No.: 116,690

[22] Filed: Jan. 30, 1980

[51] Int. Cl.[2] .......................................... H03K 17/00
[52] U.S. Cl. .................................. 307/296 R; 357/92; 307/299 B; 307/477
[58] Field of Search .................. 357/92; 307/477, 459, 307/296 R, 297 R, 299 B

[56] References Cited

U.S. PATENT DOCUMENTS 3,962,592 6/1976 Thommen .......................... 307/297
4,075,508 2/1978 Scott ................................ 357/92 X
4,109,162 8/1978 Heuser et al. .................... 357/92 X

OTHER PUBLICATIONS

J. Radovsky, "Current-Mirror Amplifiers . . .", RCA Technical Note 949, Dec. 31, 1973.

*Primary Examiner*—Rolf G. Hille
*Attorney, Agent, or Firm*—John T. O'Halloran; Thomas N. Twomey

[57] ABSTRACT

The manufacturing, fluctuations in electrical parameters of I[2]L double-collector current source transistors each of which is connected in series with a bias transistor having a base zone common with the base zone of the other bias transistors, are compensated by means of a bias voltage generator whose output voltage is fed to said common base. The bias voltage generator consists of a current mirror comprising a further I[2]L double-collector current source transistor and a further bias transistor having the same configuration and conductivity type as the I[2]L double-collector current source transistors and the bias transistors.

2 Claims, 4 Drawing Figures

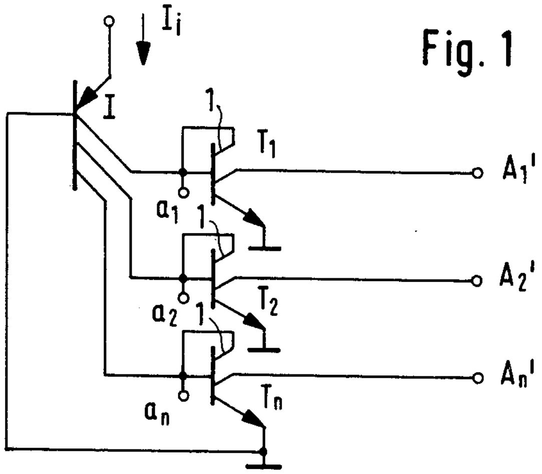
Fig. 1
Fig. 3
Fig. 2
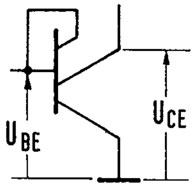
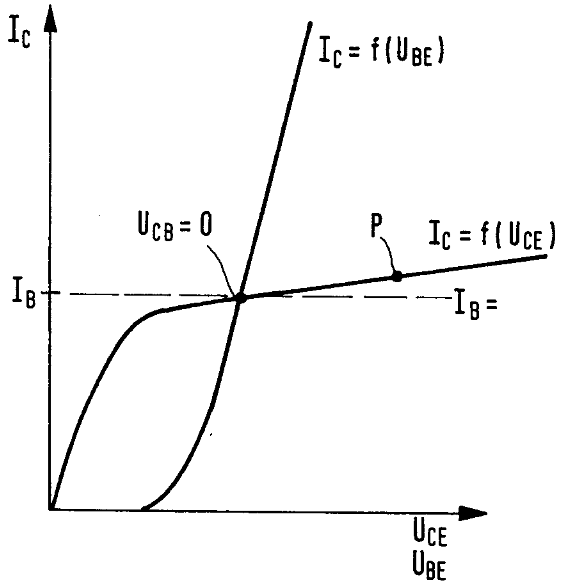

BIAS VOLTAGE GENERATOR FOR A MONOLITHIC INTEGRATED CIRCUIT

BACKGROUND OF THE INVENTION

The present invention relates to a bias voltage generator for a monolithic integrated circuit with a plurality of $I^2L$ current sources each consisting of a plurality of $I^2L$ double-collector transistors having one common injector and being individually connected in series with the emitter of a corresponding bias voltage transistor whose base zone is connected to a bias voltage lead. Such a type of bias voltage generator is used in the integrated $I^2L$ circuit serving the superposition of audio frequency signals as disclosed in the applicant's earlier U.S. Patent Application Ser. No. 101,314 for adjusting the operating point of the $I^2L$ current sources. The bias voltage generator according to the invention, however, is also suitable for use with digital-to-analog converters of similar configuration employing $I^2L$ current sources consisting of a plurality of $I^2L$ multi-collector transistors having one common injector.

The bias voltage generator in the integrated $I^2L$ circuit according to the aforementioned earlier proposal, as well as in similarly designed digital-to-analog converters serves the exact balancing of the output currents. In conventional large scale production of integrated solid state circuits on semiconductor wafers, for separation into individual units, fluctuations which occur throughout the individual semiconductor wafers cause the medium output currents of the integrated circuits on a semiconductor wafer to deviate from the mean value of other semiconductor wafers.

Uniformity is required of the output currents of each of the many integrated circuits manufactured on a semiconductor wafer. Consequently, the yield of the integrated circuit is reduced as a result of the fluctuations of the following parameters from the respective mean values of one or several semiconductor wafers:

1. fluctuations of the medium alpha values of the injector transistors,
2. fluctuations of the medium B-values of the $I^2L$ transistors,
3. fluctuations of the medium output resistances of the $I^2L$ transistors, and
4. fluctuations of the medium pairing values of alpha-B-values.

Relative thereto, it is assumed that the aforementioned fluctuations within the individual integrated circuits are of the minimum nature which can be achieved in ordinary commercial manufacturing without affecting the yield when production is carried out in accordance with the present state of the art.

SUMMARY OF THE INVENTION

It is the object of the invention, therefore, to provide a bias voltage generator for a monolithic integrated (solid-state) circuit which compensates for the aforementioned fluctuations and, without suffering any noteworthy loss of yield, permits a balancing of the individual integrated circuits to be rendered necessary.

The involved design principle of the "integrated injection logic ($I^2L$)" has been disclosed on pages 76 to 85 in "Philips Technical Review", 33, No. 3, (1973), and is also referred to as a "merged transistor logic", see "1972 IEEE International Solid-State Circuits Conference", Digest of Technical Papers, pp. 90 to 93. According to this, $I^2L$-transistors are featured by collector zones lying on the semiconductor surface, and by injectors in common to a plurality of $I^2L$-transistors, and which, as part of a lateral transistor structure, control the current flow in the vertically operated transistors, and serve as current sources. In the equivalent circuit diagram, the injector is usually represented as an equivalent circuit transistor whose base is applied to the emitter potential of the respective vertical transistor and whose collector is applied to the base of the vertical transistor. Relative thereto, the collector zone of the equivalent circuit transistor is identical with the base zone of the vertical transistor.

With respect to a bias voltage generator for a monolithic integrated circuit, this object is achieved as more fully explained in the accompanying drawings and the following explanation thereof.

BRIEF DESCRIPTION OF THE DRAWINGS

The bias voltage generator according to the invention, as well as its use and the advantages thereof, will now be explained in detail with reference to FIGS. 1 to 3 of the accompanying drawings, in which:

FIG. 1 shows the circuit diagram of a multiple current source employing $I^2L$-transistors, FIG. 2 serves to explain the mode of operation and the characteristic of a $I^2L$-double-collector transistor, and FIG. 3 shows the circuit diagram of the bias voltage generator of a monolithic integrated circuit according to the invention which is suitable for effecting the superposition of audio frequency electric signals which, as current units, and upon actuation of one key each, are fed into summing bars.

DESCRIPTION OF THE PREFERRED EMBODIMENT

Figure 4:
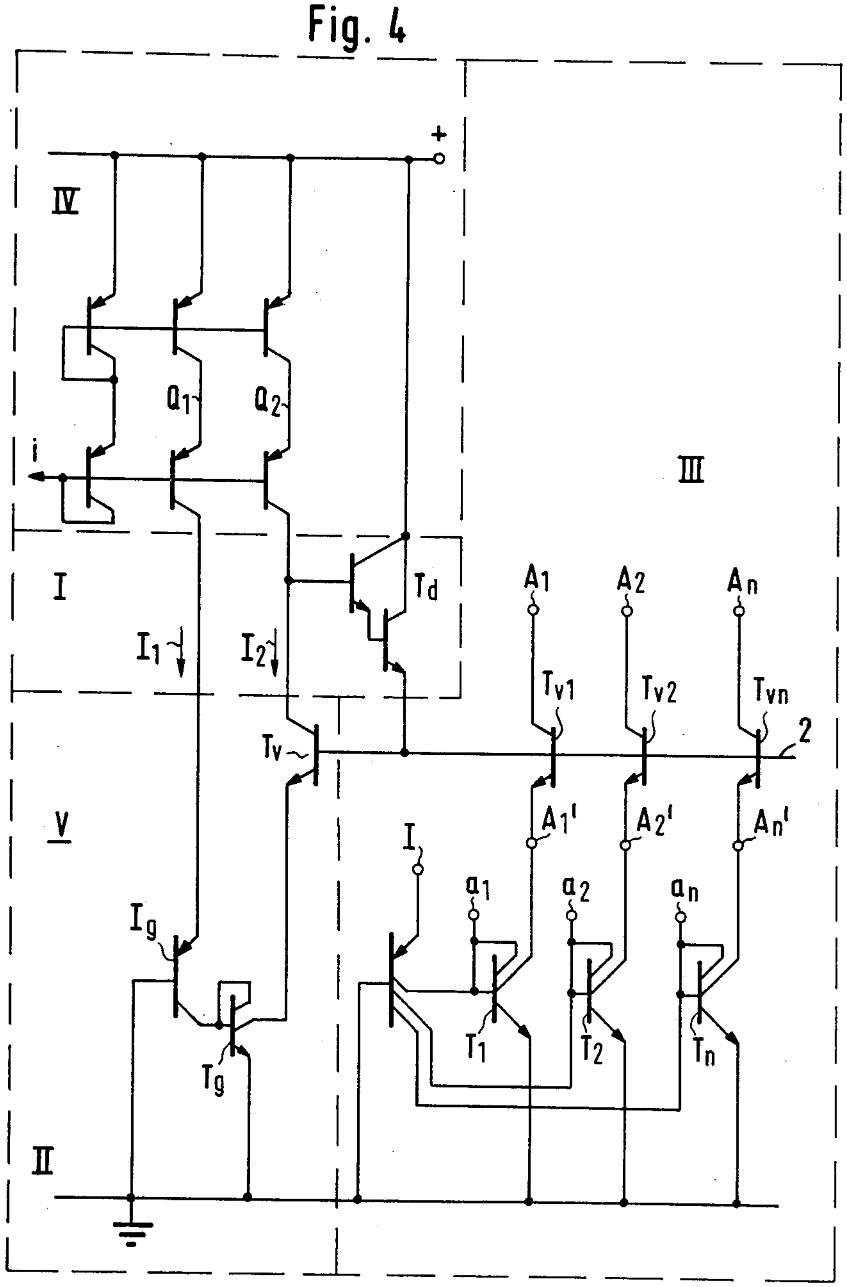

FIG. 1 shows the circuit diagram of a multiple current source in $I^2L$ configuration employing three $I^2L$ double-collector transistors T1, T2 and Tn whose first collectors 1 are galvanically and individually contacted to the associated base zones. I indicates the equivalent circuit transistor for the injector provided in common to all double-collector transistors, which is realized by an injector zone designed as the emitter of a lateral transistor and, accordingly, injects minority charge carriers into the three base zones of the double-collector transistors T1, T2 and Tn for the power supply purpose. According to the $I^2L$ design principle, the emitter zones of the double-collector transistors T1, T2 and Tn form one common zone with the base zone of the equivalent circuit transistor I. The outputs A1', A2' and A3' of the current sources are applied to the second collectors of the $I^2L$ double-collector transistors.

The multiple-current source according to FIG. 1 is used in the integrated $I^2L$-circuit for superimposing audio frequency electric signals in accordance with the aforementioned earlier proposal disclosed in the applicant's Patent Application according to which, upon actuation of a corresponding key, and via the terminals a1, a2, audio frequency signals are applied to the base zones of the $I^2L$ transistors T1, T2 and Tn. Relative thereto, n indicates the number of employed audio signals. When using the bias voltage generator in a similarly designed and monolithic integrated circuit for a digital-to-analog converter, the terminals a1, a2 are applied to the digital input signals, and the $I^2L$ transistors are designed, in accordance with the weightings allotted thereto, to have differently large dimensioned second collectors, or else a corresponding further number of parallel-connected collectors of equal size.

Owing to the alpha values of the $I^2L$ transistors T1, T2 and Tn deviating from the maximum values, the output currents appearing at the outputs A1', A2' and An', are smaller than I/n. Within a monolithic integrated circuit employing a multiple current source as shown in FIG. 1, the fluctuations of the output currents at the outputs A1', A2' and An' are sufficiently small. In a mass production of a plurality of semiconductor wafers to be divided into the individual integrated circuits, the deviations from a mean value may be considerable, so that either the individual monolithic integrated circuits have to be balanced, or else a small yield has to be accepted. This is remedied by the present invention in that there is made use of a particular peculiarity of the characteristic of $I^2L$ transistors, whenever a first collector is galvanically connected with the base.

FIG. 2 shows one such $I^2L$ transistor, and FIG. 3 shows the corresponding characteristics which are plotted as a function of the collector current $I_c$ in dependence upon the collector voltage $U_{CE}$ or else upon the base-emitter voltage $U_{BE}$ respectively. Considering that the $I^2L$ transistors have small base widths, they also have a relatively small output resistance compared with that of normal planar transistors, as is illustrated by the slope of the characteristic $I_C=f\,(U_{CE})$ in FIG. 3. This peculiarity of a relatively "poor" output resistance can be utilized for affecting the automatic balancing of monolithic integrated circits of the kind involved. The bias voltage generator according to the invention is based on this idea.

By connecting the first collector of an $I^2L$ double-collector transistor with its base, with $I_C=I_B$, there is first of all adjusted the operating point $U_{CB}=0$ according to FIG. 3, lying on a characteristic $I_C=f\,(U_{BE})$. Now, on the right of the operating point $U_{CB}$, and within limits sufficient for the quantity production of the respective monolithic integrated circuits, the collector current $I_C$ may be increased to such an extent owing to the relatively low output resistances of $I^2L$ multi-collector transistors, that there is provided the possibility of a balancing by the bias voltage generator according to the invention. In this way it is possible to compensate for the fluctuations of the above-mentioned parameters during mass production, so that a balancing of the output currents may be dispensed with.

FIG. 4 shows part of the circuit diagram of a monolithic integrated circuit of the type involved by the invention, within the dashlined box III, employing a bias voltage generator V according to the invention, within the dashlined boxes I and II, as well as a circuit comprising two current sources Q1 and Q2 within the dashlined box IV, which are required for operating the bias voltage generator according to the invention, and which supply two constant currents I1 and I2.

The box III, besides containing the multiple current source in $I^2L$ configuration, as already described with reference to FIG. 1 hereinbefore, also contains a plurality of n bias voltage transistors Tv1, Tv2, Tvn, having one common base zone or base zones galvanically connected with one another, whose emitters are individually connected in series with the corresponding second collector of the $I^2L$ double-collector transistors T1, T2 and Tn. The output signals are taken off the collector terminals A1, A2 and An of the bias voltage transistors Tv1, Tv2, Tvn. The base zones of the bias voltage transistors Tv1, Tv2 and Tvn, or the common base zone thereof respectively, are applied to the bias voltage lead 2.

On principle, the bias voltage generator according to the invention, consists of a current mirror circuit within the dashlined box II and of a non-inverting amplifier within the box I. The bias voltage lead 2 is connected with the base terminal of a further bias voltage transistor Tv of the same conductivity type and the same configuration as the other bias voltage transistor Tv1, Tv 2 and Tvn as applied to the bias voltage lead 2. The term "same configuration" means to imply that the bias voltage transistor Tv has the same dimensions and the same structure as the other bias voltage transistors which are applied to the bias voltage lead 2. Therefore, the characteristic data fluctuations as occurring during mass production of the transistor, are the same type as those of the other bias voltage transistors Tv1, Tv2 and Tvn.

The emitter of the further bias voltage transistor Tv is connected to the second collector of a further $I^2L$ double collector current source transistor Ig, Tg which, in the same way as the bias voltage transistor Tv, has the same configuration as the plurality of the other $I^2L$ current sources I; T1, T2 and Tn. In the same way, this also applies to the injector Ig which, in its configuration, corresponds to that of the injector I. The manufacturing fluctuations in electrical parameters as already mentioned hereinbefore under points 1 to 4, therefore, impress themselves upon the further $I^2L$ current sources Ig, Tg in the same way as on the remaining $I^2L$ current sources.

The injector Ig of the further $I^2L$ current sources Ig, Tg as well as the collector of the further bias transistor Tv are each connected with a current source Q1 or Q2 which supply equally high currents I1 or I2 respectively.

The construction of the current sources contained in the box IV has been chosen arbitrarily and is not germane to the subject matter of the invention. One favorable type of circuit contains two emitter-collector series connections of two transistors, with the base zones of the two transistors applied to the power supply, being connected to the base zone of a first transistor connected as a diode, and with the two base zones of the transistors not applied to the power supply, being connected to the base zone of a second transistor connected as a diode. The two transistors connected as diodes, as well as the remaining transistors of the current source are arranged in series between the power supply positive terminal, with a current i being fed into the base zone of the transistors that are not applied to the power supply.

Moreover, with the bias voltage generator according to the invention, a non-inverting amplifier is connected in such a way between the base and the collector in box I, that the current mirror is automatically balanced, thus compensating for the fluctuations of the output currents which are due to fluctuations of the manufacturing conditions.

The input resistance of the non-inverting amplifier should be relatively high so as to obtain on the bais voltage lead such a potential that $I1=I2$.

It is particularly suitable to use an amplifier with a high resistive input, such as a multi-stage Darlington amplifier Td whose base terminal is connected to the collector terminal of the further bias transistor Tv, and whose emitter terminal is connected to the bias voltage lead 2. The collector of the Darlington amplifier Td is applied to the power supply positive terminal.

In this way manufacturing fluctuations of the alpha values and of the B-values are rendered inconsequential. Moreover, at the outputs A1, A2 and An, almost voltage-independent output currents are available.

Since all transistors are placed on a monolithic crystal and, therefore, are subjected to a common manufacturing process and, moreover, are all at the same temperature, there only remain small statistic fluctuations of the output currents.

What is claimed is:

1. A bias voltage generator having a plurality of $I^2L$ current sources comprising;

a plurality of $I^2L$ double-collector current source transistors, having uniform conductivity type and configuration, a common injector connected to said $I^2L$ double-collector current source transistors, a plurality of bias voltage transistors having uniform conductivity type and configuration and each having its base connected to a single bias lead, each of said $I^2L$ double-collector source transistors connected in series with one emitter of one bias voltage transistor, a further bias voltage transistor of the same conductivity type and of the same configuration as said bias voltage transistors, having its base connected to said single bias lead, a further $I^2L$ double-collector current source transistor of the same conductivity type and of the same configuration as said $I^2L$ double-collector current source transistors connected in series with the emitter of said further bias voltage transistor, a further injector connected to the base of said further $I^2L$ double-collector current source transistor, a pluraity of current sources supplying equally high currents, one said current source connected to said further injector and one said current source connected to the collector of said further bias voltage transistor, a current mirror circuit comprising said further $I^2L$ current source transistor, said further injector and said further bias voltage transistor, a non-inverting amplifier connected between the collector and the base of said further bias voltage transistor supplying a current for balancing said current mirror circuit.

2. A bias voltage generator as claimed in claim 1, wherein a multi-stage Darlington amplifier (Td) is inserted, between the collector and the base of said further bias voltage transistor (Tv) such that the base terminal of said Darlington amplifier is applied to the collector, and the emitter terminal of said Darlington amplifier is applied to the base of said further bias voltage transistor (Tv).

* * * * *